United States Patent
Watanabe et al.

(10) Patent No.: US 11,042,134 B2
(45) Date of Patent: Jun. 22, 2021

(54) POWER SYSTEM STATUS ESTIMATION DEVICE AND STATUS ESTIMATION METHOD

(71) Applicant: Hitachi, Ltd., Tokyo (JP)

(72) Inventors: Masahiro Watanabe, Tokyo (JP); Yuki Tsujii, Tokyo (JP); KenEdward Kawakita, Tokyo (JP); Masatoshi Kumagai, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 251 days.

(21) Appl. No.: 16/338,039

(22) PCT Filed: Oct. 20, 2017

(86) PCT No.: PCT/JP2017/038039
§ 371 (c)(1),
(2) Date: Mar. 29, 2019

(87) PCT Pub. No.: WO2018/110082
PCT Pub. Date: Jun. 21, 2018

(65) Prior Publication Data
US 2019/0235452 A1    Aug. 1, 2019

(30) Foreign Application Priority Data
Dec. 16, 2016    (JP) .............................. JP2016-243976

(51) Int. Cl.
*G05B 13/04*    (2006.01)
*G06F 17/13*    (2006.01)
(Continued)

(52) U.S. Cl.
CPC .......... *G05B 13/048* (2013.01); *G05B 13/041* (2013.01); *G06F 17/13* (2013.01);
(Continued)

(58) Field of Classification Search
CPC ..... G05B 13/048; G04B 13/041; G06F 17/13; G06Q 10/04; G06Q 50/06
(Continued)

(56) References Cited

U.S. PATENT DOCUMENTS

2006/0202857 A1*  9/2006  Kawahara ............. B60L 3/0038
                                                     340/870.02
2014/0200729 A1*  7/2014  Yamane ................. G01R 31/40
                                                       700/295

(Continued)

FOREIGN PATENT DOCUMENTS

JP    2000-308258 A    11/2000
JP    2013-74639 A     4/2013
(Continued)

OTHER PUBLICATIONS

Japanese-language Office Action issued in Japanese Application No. 2016-243976 dated Apr. 28, 2020 with English translation (eight (8) pages).

(Continued)

*Primary Examiner* — Robert A Cassity
(74) *Attorney, Agent, or Firm* — Crowell & Moring LLP (57) ABSTRACT

Provided is a power system status estimation device capable of increasing the likelihood that status estimation calculations converge. Thus, a power system status estimation device 1 is equipped with: a measured value selection unit 102 for selecting a prescribed combination of measured values using which it is predicted that the power system status estimation calculations will converge, from among the measured values from each sensor provided in the power system; and a status estimation calculation unit 101 for estimating the status of the power system on the basis of the
(Continued)

prescribed combination of measured values selected by the measured value selection unit and the system model for the power system.

5 Claims, 7 Drawing Sheets (51) Int. Cl.
*H02J 13/00* (2006.01)
*H02J 3/00* (2006.01)
*G06Q 10/04* (2012.01)
*G06Q 50/06* (2012.01)
*H02J 3/18* (2006.01)

(52) U.S. Cl.
CPC ............. *G06Q 10/04* (2013.01); *G06Q 50/06* (2013.01); *H02J 3/00* (2013.01); *H02J 13/00* (2013.01); *H02J 3/18* (2013.01)

(58) Field of Classification Search
USPC .......................................................... 713/31
See application file for complete search history.

(56) References Cited

U.S. PATENT DOCUMENTS

| 2015/0142187 | A1 | 5/2015 | Yamane et al. |
| 2016/0238669 | A1* | 8/2016 | Kumagai ............... G01R 31/40 |
| 2018/0120818 | A1* | 5/2018 | Omi ................. G05B 19/41885 |

FOREIGN PATENT DOCUMENTS

| WO | WO 2013/046938 A1 | 4/2013 |
| WO | WO 2014/010030 A1 | 1/2014 |

OTHER PUBLICATIONS

International Search Report (PCT/ISA/210) issued in PCT Application No. PCT/JP2017/038039 dated Nov. 21, 2017 with English translation (five (5) pages).

Japanese-language Written Opinion (PCT/ISA/237) issued in PCT Application No. PCT/JP2017/038039 dated Nov. 21, 2017 (four (4) pages).

* cited by examiner

| MEASUREMENT POINT m | | NORMAL ACCURACY SENSOR | | | | | | | | | HIGH ACCURACY SENSOR (PMU) | | | | | | | | | TOTAL OF STATE ESTIMATION EVALUATION INDEX RESIDUAL $\Sigma\varepsilon$ |
|---|---|---|---|---|---|---|---|---|---|---|---|---|---|---|---|---|---|---|---|---|
| | | a | | | | b | | | | ... | s | | | | v | | | | ... | |
| | ITEM n | P | Q | V | θ | P | Q | V | θ | | P | Q | V | θ | P | Q | V | θ | | |
| \multirow{17}{*}{NUMBER OF TIMES OF SEARCH REPETITION} | 1 | -0.14 | 0.00 | -0.71 | 0.56 | 0.07 | 0.65 | ... | — | — | — | — | — | — | — | — | ... | 3.01 |
| | 2 | 0.28 | × | 0.85 | 0.91 | -0.29 | × | ... | — | — | — | — | — | — | — | — | ... | 3.85 |
| | 3 | 0.79 | -0.10 | -0.77 | -0.67 | -0.85 | -0.01 | ... | — | — | — | — | — | — | — | — | ... | 2.01 |
| | 4 | 0.35 | -0.62 | -1.00 | -0.42 | -0.31 | 0.35 | ... | — | — | — | — | — | — | — | — | ... | 2.35 |
| | 5 | 0.81 | 0.33 | -0.41 | 0.73 | -0.77 | -0.13 | ... | — | — | — | — | — | — | — | — | ... | NON-CONVERGENCE |
| | 6 | -0.86 | 0.49 | -0.41 | 0.91 | -0.62 | 0.25 | ... | — | — | — | — | — | — | — | — | ... | 2.64 |
| | 7 | 0.91 | -0.23 | 0.92 | 0.37 | 0.39 | -0.49 | ... | — | — | — | — | — | — | — | — | ... | NON-CONVERGENCE |
| | 8 | -0.21 | 0.97 | 0.91 | 0.94 | -0.03 | 0.36 | ... | — | — | — | — | — | — | — | — | ... | 3.81 |
| | 9 | -0.57 | × | -0.63 | 0.11 | -0.63 | × | ... | — | — | — | — | — | — | — | — | ... | 1.19 |
| | 10 | 0.93 | -0.59 | 0.30 | -0.50 | -0.04 | 0.83 | ... | — | — | — | — | — | — | — | — | ... | 2.73 |
| | 11 | 0.35 | -0.32 | -0.65 | 0.68 | -0.71 | -0.89 | ... | — | — | — | — | — | — | — | — | ... | 2.38 |
| | 12 | -0.23 | -0.54 | × | 0.26 | 0.33 | -1.00 | ... | — | — | — | — | — | — | — | — | ... | 2.74 |
| | 13 | 0.06 | 0.02 | 0.51 | -0.49 | 0.74 | 0.98 | ... | — | — | — | — | — | — | — | — | ... | 3.21 |
| | 14 | -0.87 | -0.29 | 0.36 | -0.16 | 0.06 | 0.04 | ... | — | — | — | — | — | — | — | — | ... | 2.36 |
| | 15 | 0.24 | × | 0.17 | 0.64 | -0.07 | -0.36 | ... | — | — | — | — | — | — | — | — | ... | 3.48 |
| | 16 | -0.08 | -0.79 | 0.78 | -0.39 | -0.25 | -0.53 | ... | — | — | — | — | — | — | — | — | ... | 2.57 |
| | 17 | 0.77 | 0.65 | -0.78 | -0.47 | 0.77 | 0.95 | ... | — | — | — | — | — | — | — | — | ... | NON-CONVERGENCE |

POWER SYSTEM STATUS ESTIMATION DEVICE AND STATUS ESTIMATION METHOD

TECHNICAL FIELD

The present invention relates to a power system status estimation device and a status estimation method.

BACKGROUND ART

Grasping a power flow status (effective power, reactive power, voltage, and voltage phase) of a power system is not only effective for monitoring and controlling the power system, but also useful for constructing an analysis model to be used for power flow calculation, and the like.

It is possible to predict a system status which may occur in the future and to take stabilization measures in preparation for a system fault by reproducing a status close to the current power system as the analysis model. Generally, the power system status can be grasped by measuring measured values of electric quantities (effective power, reactive power, voltage value, voltage phase, current value, and the like) by using a measurement sensor installed in the power system and by performing status estimation calculation by using the measured values. Hereinafter, the power system may be abbreviated as a system in some cases.

In order to grasp the status of the system, it is important to prepare a sufficient number of the measured values in order to solve a power equation of the system and to put the status of the system in an observable status. However, there exists a case in which the status estimation calculation may not converge, depending on a configuration of the system and a power flow condition thereof. For example, when there is a section where a resistance component of a line is large, when there is a section where a reactive power flow is large, and when, for example, voltage values of adjacent measured values are significantly different from each other, there exists a possibility that the status estimation calculation does not converge.

On the other hand, even when the status estimation calculation converges, there exists a problem that a large deviation (residual) is generated between a measured value and an estimated value such that reliability of an obtained estimation result (power flow status) deteriorates.

In Non-PTL 1, disclosed is a method in which the status estimation calculation is performed again by excluding the measured value where the deviation is generated when the large deviation is generated between the measured value and the estimated value.

In PTL 1, disclosed is a method in which a status in an estimable range is estimated even when it is not possible to mathematically solve a status estimation equation.

CITATION LIST

Patent Literature

PTL 1: JP-A-2000-308258

Non-PTL 1: "BAD DATA DETECTION METHOD IN STATUS ESTIMATION OF POWER SYSTEM" in the Transactions of the Institute of Electrical Engineers of Japan. B, Vol. 98, No. 10 (1980)

SUMMARY OF INVENTION

Technical Problem

In the related art described in PTL 1, it is possible to calculate a status estimation result of a partial system, however, all the status quantities of the original system can not be obtained.

In the related art described in Non-PTL 1, when the status estimation does not converge, the status estimation result cannot be obtained because it is not possible to determine which one is a measured value causing non-convergence.

In consideration of the above-mentioned problem, an object of the present invention is to provide a power system status estimation device and a status estimation method capable of increasing a possibility that status estimation calculation converges.

Solution to Problem

In order to solve the above-mentioned problem, a power system status estimation device according to the present invention includes: a measured value selection unit which selects a combination of predetermined measured values that are predicted to cause status estimation calculation of the power system to converge, from among measured values of respective sensors provided in the power system; and a status estimation calculation unit which estimates the status of the power system based upon the combination of the predetermined measured values selected by the measured value selection unit and a system model for the power system.

Advantageous Effects of Invention

According to the present invention, since a power system status is estimated by selecting a combination of predetermined measured values that are predicted to cause status estimation calculation to converge from among respective measured values, it is possible not only to increase a possibility of the convergence of the status estimation calculation, but also to improve usability.

DESCRIPTION OF EMBODIMENTS

Hereinafter, an embodiment of the present invention will be described with reference to the drawings. The embodiment can be utilized, for example, as a function of a power system monitoring control system, an input data creation system for power flow calculation, and an initial status creation system for various system calculations. Further, the embodiment can be also utilized in, for example, an on-line reliability monitoring system, a stability monitoring system, a countermeasure review system, a central power supply instruction station system, and the like by using the embodiment for a stability analysis system or an optimum power flow calculation system in which an obtained calculation result of status estimation is set as an initial value.

In the embodiment, as will be described later, with respect to a measured value to be used as input data of power system status estimation calculation, status estimation calculation converges, and a combination of the measured values for obtaining a more accurate estimation result is obtained.

Therefore, a device for estimating the power system status of the embodiment includes a system model database DB1; a measured value database DB2; an input data correction database DB3; and a result database DB4, and further includes a status estimation calculation unit 101, an input data measured value combination search unit 102, a bottleneck index calculation unit 103, and a calculation result recording unit 104.

In the embodiment, the combination of measured values to be used for the status estimation or a combination of measured values to be excluded can be automatically obtained. Accordingly, in the embodiment, it is possible to increase a possibility of avoiding the occurrence of a situation in which the status estimation calculation does not converge. Further, in the embodiment, labor and time required for creating the input data can be shortened. Further, in the embodiment, since the combination of the measured values can be optimized, an estimated residual which is a difference between a measured value and an estimated value can be made to be smaller, thereby obtaining the more accurate estimated result. Further, in the embodiment, since it is also possible to discriminate bad data which cause the status estimation calculation not to converge, a malfunction such as failure of a sensor, and the like can be grasped.

First Embodiment

An embodiment will be described with reference to FIGS. 1 to 8. The embodiment described hereinbelow is an example, and the present invention is not limited to a configuration of the embodiment.

A process function configuration of a power system status estimation device 1 will be described with reference to FIG. 1. As will be described later in FIG. 3, the status estimation device 1 can be configured by using a computer. The status estimation device 1 includes, for example, the status estimation calculation unit 101; the input data measured value combination search unit 102; the bottleneck index calculation unit 103; and the calculation result recording unit 104; the system model database DB1; the measured value database DB2; the input data correction database DB3; and the result database DB4.

The status estimation calculation unit 101 estimates the power system status by using a general algorithm established as a power system status estimation calculation method. The input data measured value combination search unit 102 is an example of "a measured value selection unit". Hereinafter, the measured value selection unit may be abbreviated as the combination search unit 102 in some cases. As will be described later, the bottleneck index calculation unit 103 calculates a bottleneck index ΔFmn which is an example of an "evaluation index". The calculation result recording unit 104 outputs calculation results of the status estimation device 1 to the result DB4. Apart or the whole of the calculation results may be displayed on a display according to an instruction of a user.

Figure 1:
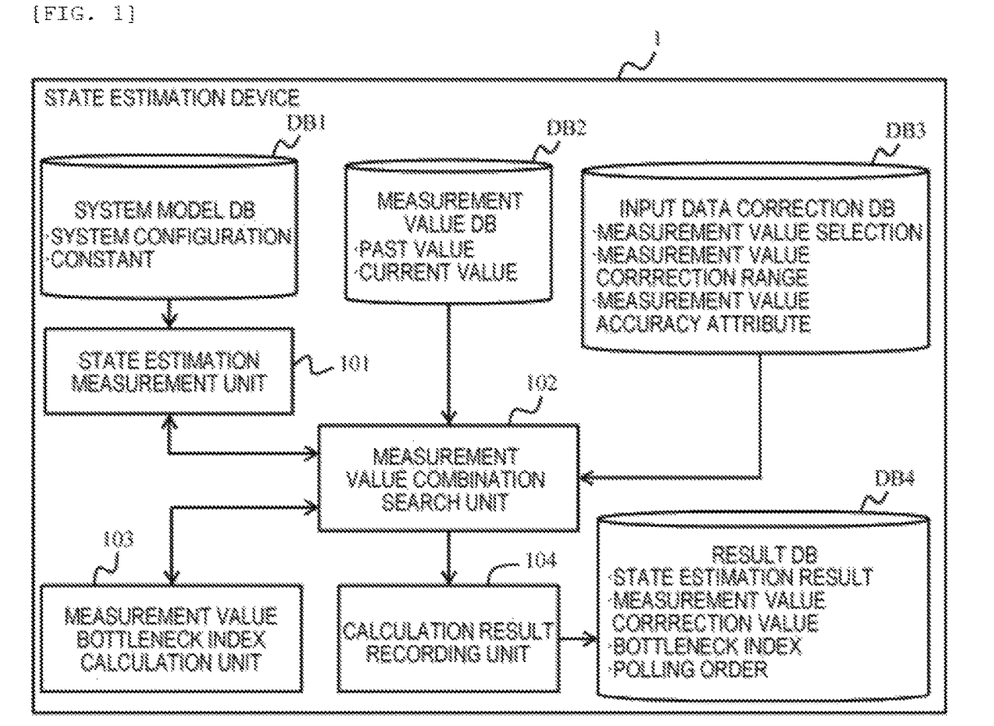
FIG. 1 is a functional block diagram of a power system status estimation device.

Further, a connection relationship between the process functions 101 to 104 and the databases DB1 to DB4 and an arrow direction in a connection direction therebetween, which are illustrated in FIG. 1, are examples and are not limited to a configuration illustrated in the diagram.

Figure 2:
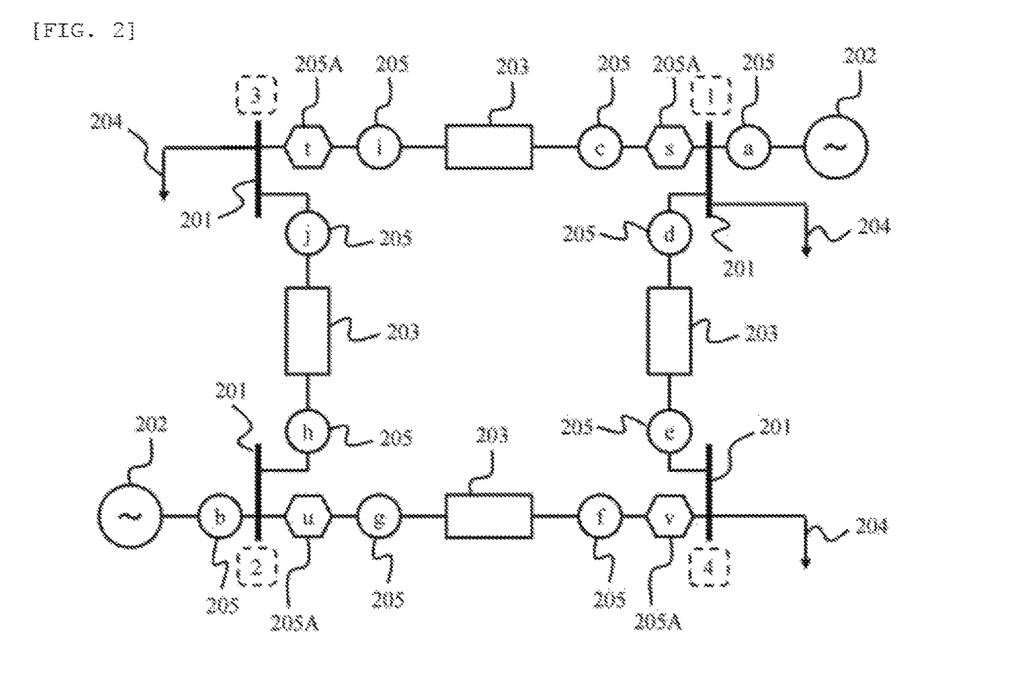
FIG. 2 is an example of an analysis model for a power system.

An outline of a method of estimating the power system status will be described with reference to FIG. 2. FIG. 2 illustrates an example of an analysis model for the power system.

The power system represented by the system analysis model is configured to include, for example, a node (bus) 201, a generator 202 connected to the node 201, a power transmission line 203 connected to each node 201, and a load 204 connected to the node 201. Further, a number surrounded by a square of a dotted line indicates a node number set for convenience.

On a line in the vicinity of each node, sensors 205 and 205A are installed in corresponding places in an actual system. In the sensor 205, for example, effective power, reactive power, voltage, and current of the line are measured, and the data of measured values thereof are collected via a monitoring control device which is not illustrated.

The sensor 205A is a sensor having higher accuracy than that of the normal sensor 205. In the sensor 205A having higher accuracy, it is possible to use a measurement sensor such as, for example, a phase measurement unit (PMU) capable of also measuring voltage phase information with high accuracy.

In order to construct the analysis model for the power system as illustrated in FIG. 2 and to calculate the power flow, a power generation amount (effective power, reactive power) of the generator 202, a terminal voltage thereof, and an effective power amount and a reactive power amount of the load 204 are required in addition to system configuration information such as connection configuration of the line and line impedance.

In order to create an analysis model of a status close to a current system, it is required to estimate the electric quantity based upon measurement information of the measurement sensors 205 and 205A of the system. Here, errors caused by miscalculation of a CT (Current Transformer: converter) and a PT (Potential Transformer: instrument transformer), digital sampling, effective value calculation, and the like are usually included in the measured values of each of the sensors 205 and 205A. Therefore, status estimation calculation is performed to obtain a power flow status in which a square error of each measured value and calculated value becomes minimum from measurement information from more sensors than minimum measurement information required for solving a power equation of the system.

In the status estimation calculation, there may be a case in which the status estimation calculation does not converge depending on a configuration of the system and a power flow condition thereof. Even when the calculation converges, there exists a case in which a large deviation (residual) is generated between a measured value and an estimated value such that reliability of an obtained estimation result (power flow status) may deteriorate. In order to cause the status estimation calculation to converge, it is important to obtain a combination of input values of the status estimation calculation for causing the status estimation calculation to converge and obtaining a more accurate estimation result from among many measured values. Hereinafter, a configuration example for obtaining a combination of appropriate input values (measured values) will be described.

Figure 3:
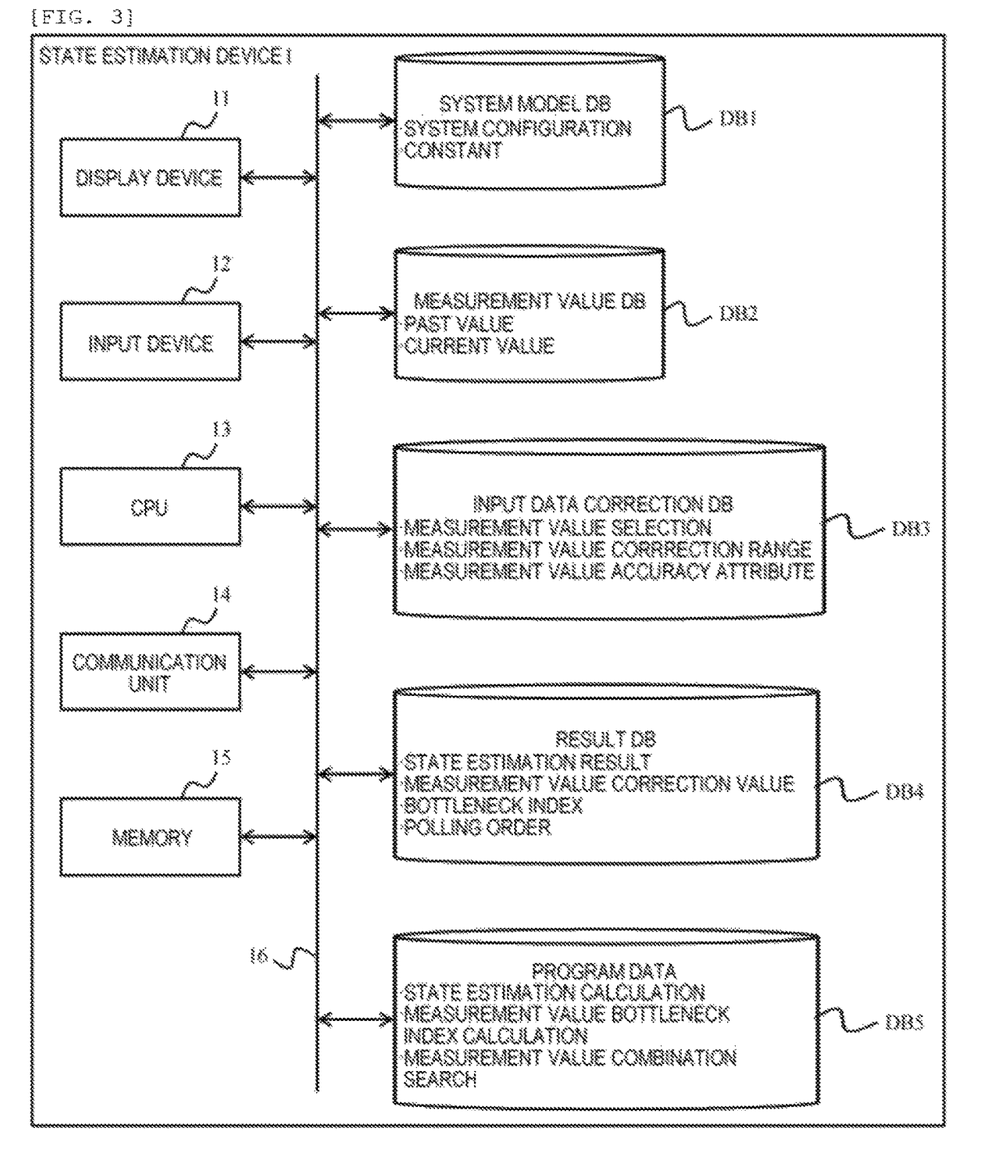
FIG. 3 is a configuration diagram of the power system status estimation device.

FIG. 3 illustrates a configuration example of the power system status estimation device 1. The status estimation device 1 is configured by a computer system. In the status estimation device 1, for example, a display device 11, an input device 12 such as a keyboard, a mouse, and the like, a CPU 13, a communication device 14, a memory 15, and various databases DB1 to DB5 are connected to a bus line 16.

The CPU (Central Processing Unit) 13 realizes each predetermined function which will be described later by performing a predetermined computer program. The CPU 13 instructs generation of image data to be displayed on the display device 11 and performs data retrieval, and the like in various databases.

The memory 15 is a storage device that stores various data. For example, the memory 15 illustrated in the diagram may include not only a RAM (Random Access Memory), but also an auxiliary storage device such as a hard disk drive, a flash memory device, and the like.

The memory 15 stores system model data such as a system configuration, a system constant, and the like, current and past measured value data, correction data of the input data to be used for the status estimation, calculation result data, and the like. The correction data of the input data (also referred to as input data correction data) are, for example, data indicating attributes of measured values such as use priority, measurement accuracy quality, and the like. The calculation result data include, for example, a result of the status estimation calculation, a combination of used measured values, an index of a measured value to be a bottleneck, and the like.

The CPU 13 generates necessary image data based upon the data stored in the memory 15, and displays the generated image data on the display device 11.

The display device 11 is a device for providing information to a user such as a system manager by the status estimation device 1. The display device 11 is constituted of, for example, a display. The status estimation device 1 may be provided with a printer, a voice output device, and the like in addition to the display.

The input device 12 is a device for a user to input data, and the like into the status estimation device 1. The input device 12 is constituted of, for example, a keyboard, a mouse, a touch panel, a voice recognition device, and the like.

The communication device 14 is a communication interface circuit for the status estimation device 1 to communicate with an external computer or an external device (both not illustrated in the diagram) via a communication network.

An operation terminal used for information exchange with the user may be provided separately from the status estimation device 1. The user can also exchange the information with the status estimation device 1 by accessing the status estimation device 1 using the operation terminal.

The five databases DB1 to DB5, which are roughly divided, are mounted in the power system status estimation device 1.

In the system model database DB1, data with respect to each facility constituting the power system such as the line 203 and the generator 202 are stored. As the data with respect to the line, for example, resistance, reactance, and ground capacitance are included. As the data with respect to the generator, for example, capacity, transient reactance, and the like are included. The data with respect to the system configurations are required when performing the power system status estimation calculation.

In the measured value database DB2, data of measured values in the past and data of measured values at present are stored.

In the input data correction database DB3, data related to data (input data) to be inputted for the status estimation such as the attributes of the measured values, and the like are stored. The attributes of the measured values include, for example, the priority which is taken into consideration when using the measured values, the measurement accuracy quality, and the like.

In the result database DB4, a system power flow status which is a power system status estimation calculation result, system analysis model data, a measured value correction value, a bottleneck index value for each measured value, and polling order information which becomes priority order for acquiring the measured value are stored. The data are stored in the result database DB4, thereby making it possible not only to confirm the status estimation calculation result, but also to prepare the input data such as the power flow calculation, and the like.

The program database DB5 stores a status estimation program PR1, a calculated value bottleneck index calculation program PR2, and a measured value combination search program PR3. The computer programs described above are read out and performed by the CPU 13 as necessary. When the status estimation program PR1 is performed, the status estimation calculation unit 101 described in FIG. 1 is implemented. When the calculated value bottleneck index calculation program PR2 is performed, the measured value bottleneck index calculation unit 103 is implemented. When the measured value combination search program PR3 is performed, the measured value combination search unit 102 is implemented.

Figure 4:
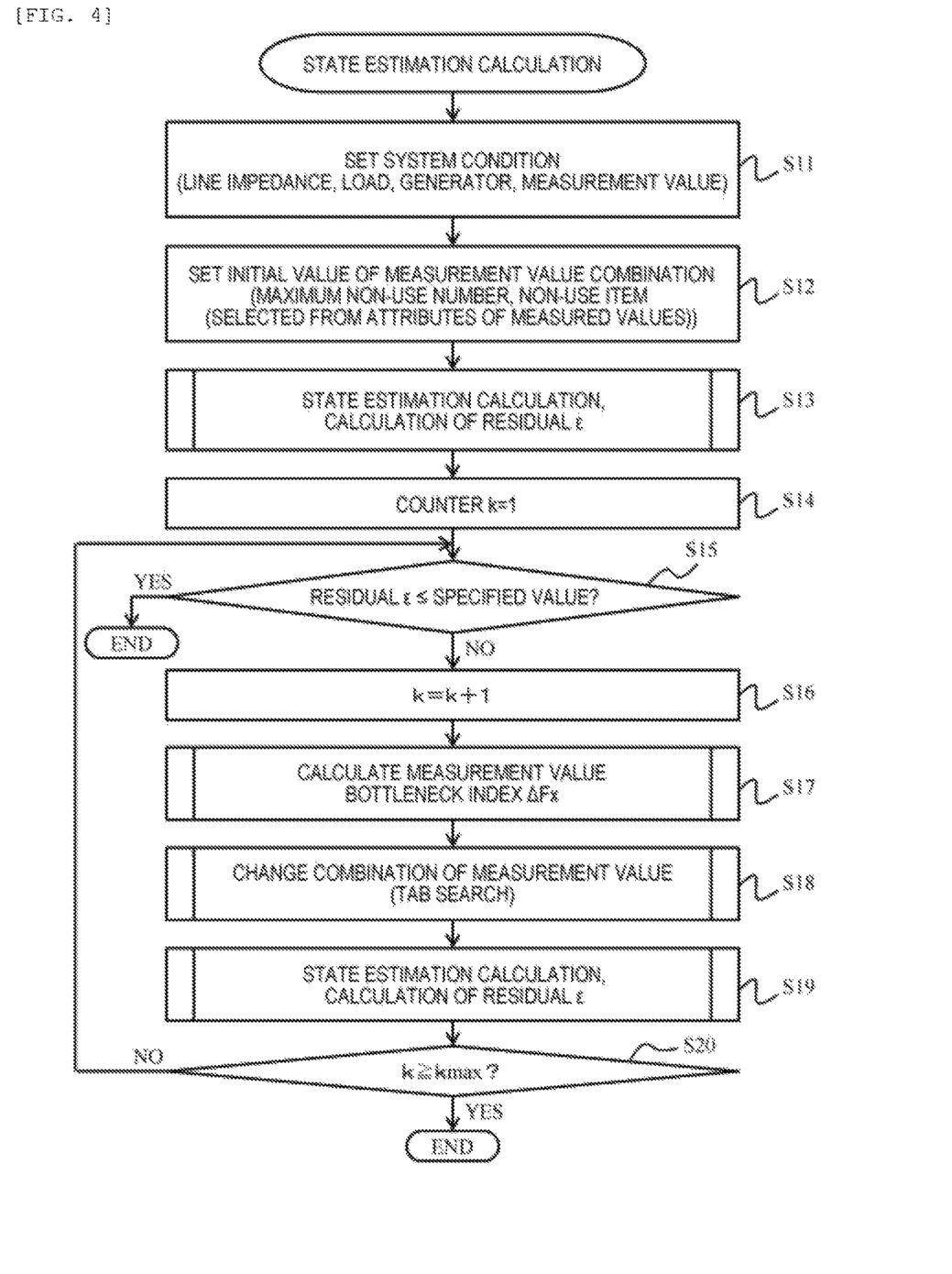
FIG. 4 is a flowchart illustrating an overall process of status estimation.

An example of a status estimation process algorithm of the power system including a process of obtaining the combination of the input values of the status estimation calculation will be described with reference to a flowchart illustrated in FIG. 4.

The status estimation device 1 first sets a system condition in step S11. Step S11 is performed by the combination search unit 102.

In step S12, the status estimation device 1 sets an initial value of a measured value combination. For example, the status estimation device 1 sets the setting of the maximum non-use number of the measured values and the setting of non-use items based upon the attribute data of each measured value. The status estimation device 1 sets a sensor having high accuracy such as the PMU to be surely used for the status estimation calculation, and sets other sensors so that a range (within an upper limit value) in which observability is maintained can be unused therefor. In this manner, the number of sensor combination patterns which will be described later can be reduced and the calculation time can be shortened by providing a plurality of the priority order of the sensors used for the status estimation calculation according to the attributes of the sensors.

In step S13, the status estimation device 1 performs the status estimation calculation based upon the data prepared in steps S11 and S12, and temporarily stores a calculation result including an estimated residual (difference 6 between the measured value and the estimated value) obtained in a calculation process. This process is performed by the status estimation calculation unit 101.

In step S14, the status estimation device 1 initializes a counter k to 1 as initial setting for searching for the combination of the measured values used for the status estimation.

In step S15, the status estimation device 1 compares the residual 6 calculated in step S13 with a specified value. When the residual 6 is equal to or less than the specified value (S15: YES), it is determined that a sufficiently effective solution is obtained, and this process is normally terminated. When the residual 6 is equal to or greater than the specified value (S15: NO), the process proceeds to step S16.

In step S16, the status estimation device 1 increments the counter k by one in order to count the number of times of repetition of the process.

In step S17, the status estimation device 1 calculates a bottleneck index ΔFx of the measured value. As will be described later, the bottleneck index is calculated for each measured point m and for each measured item n.

In step S18, the status estimation device 1 performs a process of changing the combination of the measured values used for the status estimation calculation. The combination change process can be performed by using, for example, a heuristic method such as a tab search method which will be described later. Alternatively, when a system scale is small, the solution may be obtained by totally searching for the combination of the measured values.

In step S19, the status estimation device 1 performs the status estimation calculation according to the combination of the measured values obtained in step S18 and temporarily stores the calculation result including the estimated residual.

In step S20, the status estimation device 1 determines whether or not the counter k, which is a count value with respect to the process of the measured value combination pattern, becomes equal to or greater than the upper limit value kmax. When the counter k becomes equal to or greater than the upper limit value kmax (S20: YES), the process is normally terminated. When the counter k is less than the upper limit value kmax (S20: NO), the process returns to step S15, and the measured value combination search is repeated. When the process is terminated, the status estimation device 1 stores the best solution among the calculated solutions in the result database DB4. This process is performed by the calculation result recording unit 104.

Figure 5:
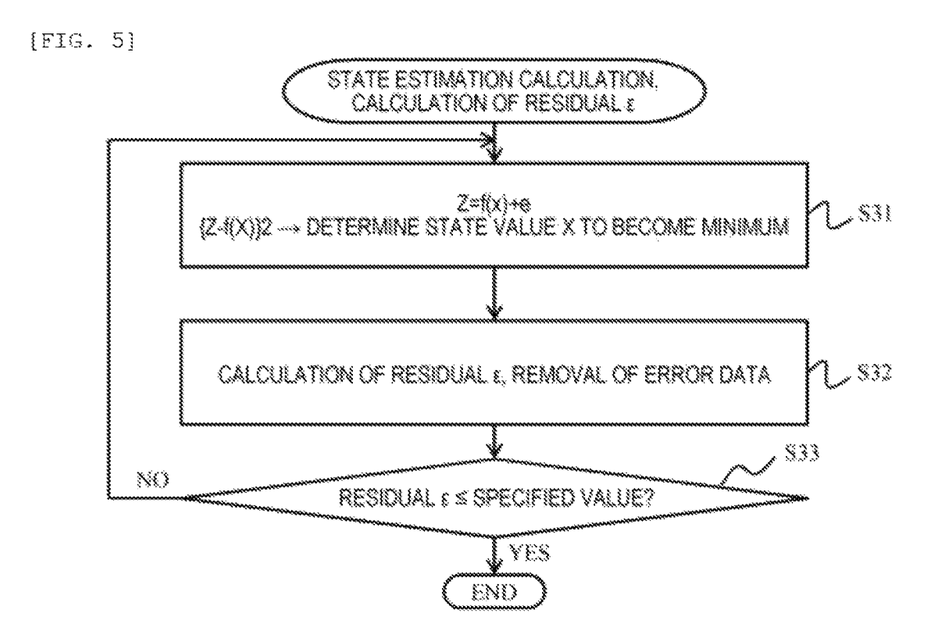
FIG. 5 is a flowchart of a status estimation calculation process.

An example of the status estimation calculation will be described with reference to a flowchart illustrated in FIG. 5. In step S31, the status estimation device 1 determines a status value X so that a value of an equation 2 becomes minimum from a relationship between an observation value Z, a system status value f(X), and a system error "e" represented in Equation 1.

$$Z=f(x)+e \quad \text{(Equation 1)}$$

$$\{Z-F(x)\}2 \rightarrow \text{minimum} \quad \text{(Equation 2)}$$

Here, Z is an observation value (P, Q, V); X is a system status (V, θ, and the like); and F (X) is a status value (a circuit equation determined from a connection status of a circuit and impedance thereof).

In step S32, the status estimation device 1 calculates the residual 6 and deletes error data. The status estimation device 1 removes, for example, a measured value having a large residual or replaces the error data with an alternative pseudo measured value (for example, measured value data in the past), thereby removing the error data.

In step S33, the calculated residual 6 is compared with a specified value. When the residual 6 is equal to or less than the specified value, the process is normally terminated, and when the residual 6 is equal to or greater than the specified value (S33: NO), the process returns to step S31.

Further, such the power system status estimation calculation is an established calculation method as described in Non-PTL 1, and can be performed by using a general algorithm.

Figure 6:
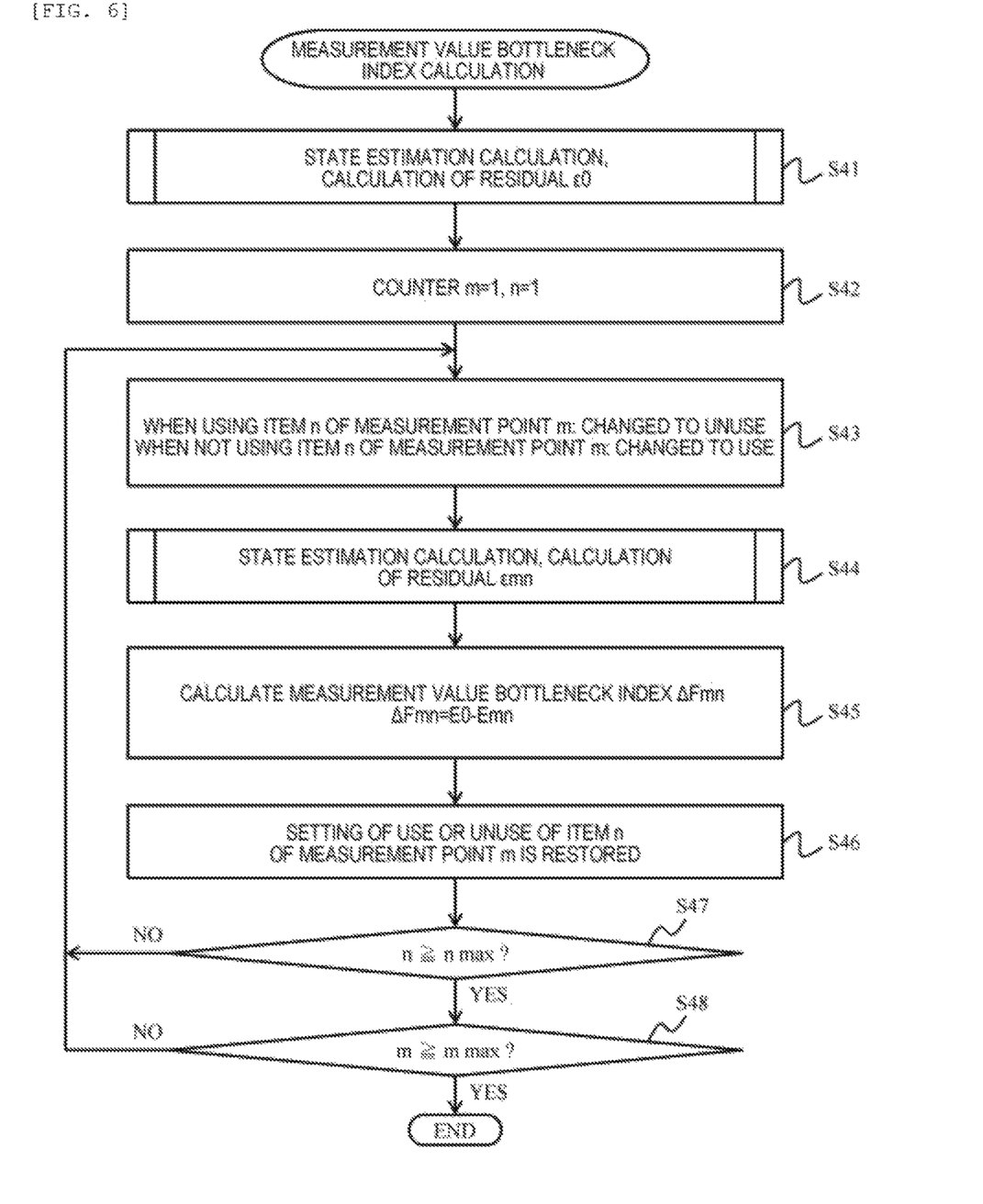
FIG. 6 is a flowchart of a process of calculating a bottleneck index of a measured value.

A process outline indicating an example of the bottleneck index calculation unit 103 in FIG. 1 and step S17 in FIG. 4 will be described with reference to a flowchart in FIG. 6.

In step S41, the status estimation device 1 performs the status estimation calculation, and temporarily stores the calculation result including the estimated residual obtained in the calculation process.

In step S42, the status estimation device 1 initializes a value of the measured point m and a value of the measured item n thereof which are search counters (respectively set to 1).

In step S43, the status estimation device 1 determines whether or not to use the measured item of the measured point as the input data for the status estimation. Specifically, the status estimation device 1 changes the measured item of the measured point to "non-use" when the item n of the measured point m is "used", and changes the measured item of the measured point to "used" when the item n of the measured point m is "unused".

In step S44, the status estimation device 1 performs the status estimation calculation in the same manner as that of step S41 by using the combination of the measured items set in step S43, and temporarily stores the calculation result including the estimated residual obtained in the calculation process.

In step S45, the status estimation device 1 calculates a measured value bottleneck index ΔFmn according to an equation 3.

$$\Delta Fmn = \varepsilon 0 - \varepsilon mn \quad \text{(Equation 3)}$$

In step S46, the status estimation device 1 restores the setting change of "use" or "non-use" of the item n of the measured point m performed in step S43.

In step S47, the status estimation device 1 determines whether or not a measured item counter n for each measured point reaches an upper limit nmax. When the measured item counter n does not reach the upper limit (S47: NO), the process returns to step S43.

In step S48, the status estimation device 1 determines whether or not a measured point counter m reaches an upper limit mmax. When the measured point counter m does not reach the upper limit (S48: NO), the process returns to step S43. When calculating the bottleneck indexes for all the measured points, the status estimation device 1 normally terminates this process.

Figure 7:
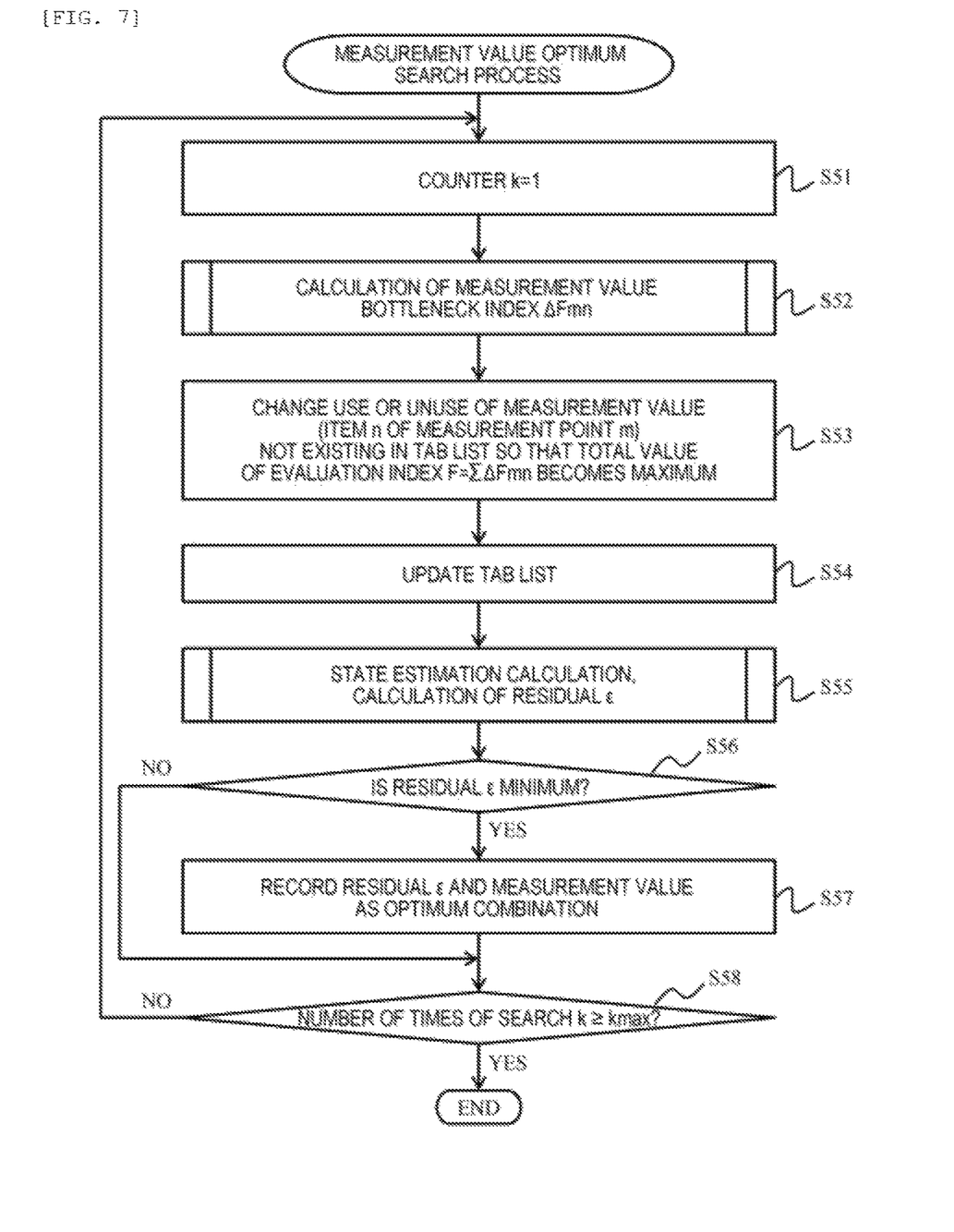
FIG. 7 is a flowchart illustrating a process of searching for an optimum combination by changing a combination of measured values.

A process outline of the combination search unit 102 in FIG. 1 and a measured value combination change (tab search) of step S18 in FIG. 4 will be described with reference to a flowchart in FIG. 7.

In step S51, the status estimation device 1 initializes the counter k that measures the number of times of searching for the tab search to 1.

In step S52, the status estimation device 1 calculates the measured value bottleneck index ΔFmn. This process is performed by the aforementioned process flow in FIG. 6.

In step S53, the status estimation device 1 changes the use or non-use setting of the measured value (item n of measured point m) that does not exist in a tab list so that the total value of evaluation indexes F(=ΣΔFmn) becomes maximum.

In step S54, the status estimation device 1 updates the tab list.

In step S55, the status estimation device 1 performs the status estimation calculation, and temporarily stores the calculation result including the estimated residual obtained in the calculation process.

In step S56, the status estimation device 1 compares the residual 6 calculated in step S55 with the search results obtained so far. When the latest residual ε is smaller than the minimum value of the status estimation results searched so far (S56: YES), the status estimation device 1 proceeds to step S57 and records the residual 6 and the measured value as an optimum combination, and otherwise (S56: NO), the process proceeds to step S58.

In step S58, the status estimation device 1 determines whether or not the counter k of the number of times of search reaches the upper limit kmax. When the counter k thereof does not reach the upper limit (S58: NO), the process returns to step S51. When the counter k thereof reaches the upper limit kmax (S58: YES), the process is normally terminated.

The effectiveness of a proposed method will be described by a schematic example by using a table illustrated in FIG. 8. The illustrated table represents a numerical value of the bottleneck index of each measured item (for example, effective power P, reactive power Q, voltage V, and the like) of each sensor and the total of evaluation index residuals Σε.

The numerical value of the bottleneck index indicates a fact that in the case of "+", the residual becomes smaller when changing the use or non-use of the sensor (result is improved), and in the case of "−", the residual becomes larger when changing the use or non-use of the sensor (result deteriorates). A place in which "x" is described instead of the numerical value indicates a fact that the bottleneck index cannot be calculated because the status estimation does not converge. A place marked in black indicates a fact that the measured value corresponding to the status estimation calculation of the number of times of repetition is not used.

Each line represents a search step which repeats the status estimation calculation while changing the combination of the measured point and the measured item. In this example, this search is repeated 17 times.

A target for changing the combination of the measured point and the measured item is selected from a sensor having normal accuracy, and a sensor having high accuracy (PMU, and the like) is excluded from the target (set to be always used).

The combination of the measured items is changed by changing the setting of the use or non-use of the item whose numerical value of the bottleneck index is the greatest on the + side at each repetition number. Here, a length of the tab list is 3. That is, the measured item whose setting of the use or non-use is once changed is prohibited from changing the setting thereof until the search is repeated three times (process procedure of tab search).

In this case, it is found out that the ninth repetition number is the best solution with the smallest total residual value which is the status estimation evaluation index. Further, there exist times (times displayed as "non-convergence") when the status estimation does not converge depending on the number of times of search.

Accordingly, even in a case where the status estimation does not converge, it is possible not only to increase the possibility of obtaining a convergent solution but also to obtain a solution (a plausible solution) having a smaller residual by changing the combination of the measured point and the measured item used for the calculation.

According to the embodiments as described above, since the combination of the measured values that are predicted to cause the status estimation calculation to converge is selected from among a plurality of measured values and then the power system status is estimated, reliability and usability of the status estimation device 1 can be improved.

According to the embodiment, the residual can be reduced by optimizing the combination of the measured values, thereby making it possible to perform the estimation with higher reliability.

According to the embodiment, since the bad data having large residual can be detected, the malfunction of the sensor can be remotely diagnosed from the residual.

According to the embodiment, since all the measured values of the sensors 205A having high accuracy are used and the measured values of the sensors 205 other than the sensors 205A are used within a predetermined range according to the accuracy, it is possible to estimate the power system status efficiently and with high reliability.

Figure 8:
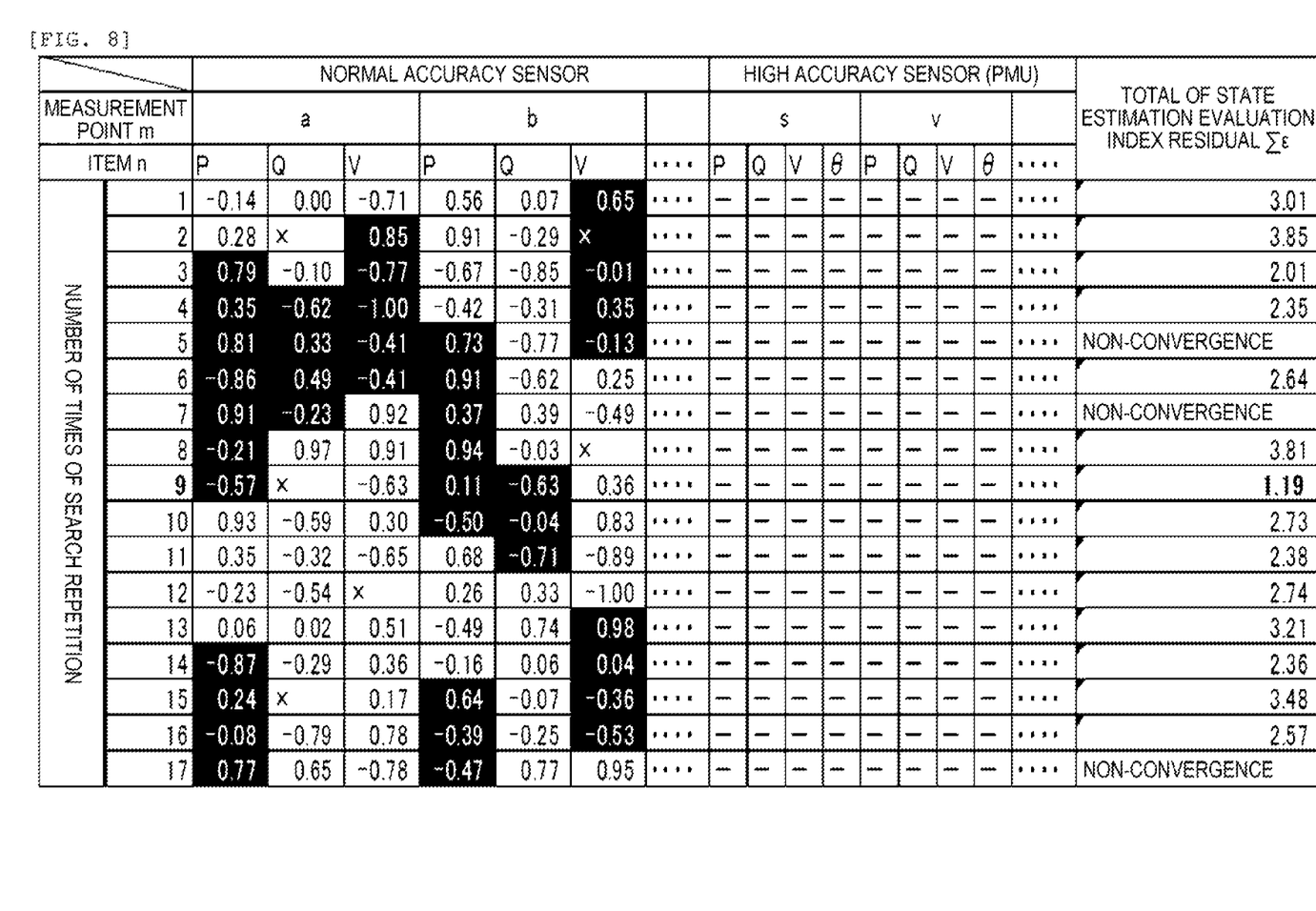
FIG. 8 is a table illustrating an example of searching for the combination of the measured values.

According to the embodiment, for example, since all or apart of the information included in the table illustrated in FIG. 8 can be displayed on the display device 11, a user can easily confirm the details of the status estimation calculation, thereby improving the usability.

Further, the present invention is not limited to the embodiments described above. Those skilled in the art can perform various additions, modifications, and the like within the scope of the present invention. The above-mentioned embodiments are not limited to the configuration examples illustrated in the accompanying drawings. The configuration and the process method of the embodiments can be appropriately modified with the scope of achieving the object of the present invention.

Further, each configuration component of the present invention can be arbitrarily selected, and the invention including the selected configuration is also included in the present invention. Further, the configuration described in the scope of the claims can be combined with a combination other than the combination explicitly specified within the scope of the claims.

REFERENCE SIGNS LIST

1: power system status estimation device
101: status estimation calculation unit
102: measured value combination search unit
103: measured value bottleneck index calculation unit

The invention claimed is:

1. A power system status estimation device which estimates a status of a power system, comprising:
a CPU;
a memory in communication with the CPU, the memory storing a plurality of instructions executable by the CPU to cause the power system status estimation device to:
select a combination of predetermined measured values from among a plurality of measured values generated by a plurality of respective sensors provided in the power system that are predicted to cause the estimated status of the power system to converge;
exclude at least one of the plurality of measured values generated by the plurality of respective sensors from the selected combination of predetermined measured values, wherein
the plurality of respective sensors are communicatively coupled via a plurality of bus nodes connected via one or more power transmission lines and disposed within the power system in proximity to at least one of a power generator or a load, and the plurality of respective sensors are configured to measure at least one of effective power, reactive power, voltage, voltage phase, or current;

estimate the status of the power system based upon the combination of the selected predetermined measured values and a system model for the power system stored in the memory, wherein the estimation of the status of the power system is repeated and each repetition is counted by a search counter, and the selected combination of measured values of the respective plurality of sensors is changed for each repetition counted by the search counter such that the estimated status of the power system is predicted to cause to converge; and set a priority for the selection of the combination of predetermined measured values according to sensor attributes for the respective plurality of sensors, wherein the combination of the predetermined measured values predicted to cause the estimated status to converge is further selected by identifying a subset plurality of sensors from the plurality of respective sensors based upon the set priority for which at least one of the associated generated measured values of each sensor of the identified subset plurality of sensors is included within the selected combination of measured values, and the combination of measured values of the subset plurality of sensors is changed for each repetition counted by the search counter.

2. The power system status estimation device according to claim 1, wherein the priority is set to be high as the sensor has higher accuracy, and the memory further comprises instructions executable by the CPU to cause the power system status estimation device to:

identify the sensor having the high priority from among the respective sensors to be included within the subset plurality of sensors.

3. The power system status estimation device according to claim 2, wherein the memory further comprises instructions executable by the CPU to cause the power system status estimation device to:

select all the measured values of a sensor having high priority and high accuracy among the respective sensors as a part of the combination of the predetermined measured values, and partially select the measured values of a sensor other than the sensor having high accuracy among the respective sensors as another part of the combination of the predetermined measured values according to the accuracy.

4. The power system status estimation device according to claim 1, wherein the memory further comprises instructions executable by the CPU to cause the power system status estimation device to:

generate a deviation between an estimated value and a measured value as an evaluation index, and select the combination of the predetermined values from among the respective measured values based upon the evaluation index.

5. The power system status estimation device according to claim 4, wherein the memory further comprises instructions executable by the CPU to cause the power system status elimination device to:

output the selection result.

* * * * *